United States Patent [19]

Tijburg et al.

[11] Patent Number: 5,674,779
[45] Date of Patent: Oct. 7, 1997

[54] METHOD FOR FABRICATING A RIDGE-SHAPED LASER IN A CHANNEL

[75] Inventors: Rudolf P. Tijburg, Geldrop, Netherlands; Kevin W. Haberern, Hopewell Junction; Sharon J. Flamholtz, Fishkill, both of N.Y.

[73] Assignee: Philips Electronics North America Corporation, New York, N.Y.

[21] Appl. No.: 515,667

[22] Filed: Aug. 16, 1995

[51] Int. Cl.$^6$ ........................................ H01L 21/20
[52] U.S. Cl. ........................................ 437/129; 437/127
[58] Field of Search ........................................ 437/129, 127

[56] References Cited

U.S. PATENT DOCUMENTS

| | | |
|---|---|---|
| 5,213,998 | 5/1993 | Qui et al. ........ 437/129 |
| 5,363,395 | 11/1994 | Gaines et al. . |
| 5,366,927 | 11/1994 | Schetzina ........ 437/129 |
| 5,395,791 | 3/1995 | Cheng et al. ........ 437/129 |
| 5,399,885 | 3/1995 | Thijs et al. . |

OTHER PUBLICATIONS

Electronics Letters, Nov. 8, 1979, vol. 15, No. 23, pp. 763–765, I. P. Kaminow, et al., "Single–Mode C.W. Ridge–Waveguide Laser Emitting at 1.55μm."

Appl. Phys. Lett. 48 (2), Jan. 13, 1986, pp. 89–91, M. Ikeda et al., "Room–temperature Continuous–wave Operation of an AlbaInP Mesa Stripe Laser."

Primary Examiner—Robert Kunemund
Attorney, Agent, or Firm—Michael E. Marion

[57] ABSTRACT

A method for manufacturing a ridge in a channel laser diode in II-VI materials by etching grooves to form an active mesa flanked by support mesas. The method involves using certain etchants for certain compositions of the II-VI layers so that the grooves can be formed by wet chemical etching using only a single photolithographic process.

25 Claims, 1 Drawing Sheet

METHOD FOR FABRICATING A RIDGE-SHAPED LASER IN A CHANNEL

This invention relates semiconductor laser diodes, and in particular to semiconductor laser diodes of the ridge-type.

BACKGROUND OF THE INVENTION

Ridge-type semiconductor laser diodes, sometimes known as mesa stripe lasers, typically comprise a structure built up on a III-V substrate such as GaAs by epitaxial deposition, usually by MOVCD or MBE, of very thin layers of III-V or II-VI materials to form cladding, wave-guiding, and capping layers, followed by metallizations to contact the substrate and the active mesa top on opposite sides of a P-N junction. Efficient operation depends on population inversion of carriers under modest current conditions, which requires that carrier injection and photon generation be confined laterally. An active mesa structure functions to confine the carrier injection and photon generation laterally. The active mesa resembles a ridge or stripe; hence, the name ridge-shaped stripes. To confine the photons vertically, the layers flanking the active layer are given lower refractive indices.

The resultant active stripes have very small dimensions, typically about 1–50 µm wide and about 0.5–10 µm high, and are vulnerable to damage. Especially is this the case where the device is mounted upside down with the mesa side on a heat sink, which aids in cooling the device. It is known to provide the active mesa in a channel flanked by side mesas to protect the active mesa from physical damage. This has been accomplished in the past by a number of processing steps involving several photoresist applications, mask alignments, exposures and etching steps. This has proved to be time consuming and more prone to rejects due to the large number of steps required.

Further, the situation is aggravated for certain kinds of laser devices, such as II-VI laser devices, because of the sensitivity of these layers to contamination.

SUMMARY OF THE INVENTION

An object of the invention is an improved method for making semiconductor laser diodes.

A further object of the invention is an improved method for making semiconductor ridge-shaped lasers in a channel.

The invention is based on the discovery that certain wet chemical etching treatments can be carried out to produce the desired structure of the ridge-shaped laser in a channel using only one photolithographic process, including one photoresist application and one mask alignment and exposure step.

A feature of the invention is based on the discovery that with certain layer compositions, a higher etch rate is experienced closer to the photoresist layer than further away, with the result that the same material preferentially etches at certain locations. This unusual result provides a favorable mesa structure which simplifies subsequent processing.

According to one aspect of the invention, the laser structure comprises a graded layer preferably of ZnTe-ZnSe adjacent a ZnSe contact layer in turn adjacent a quarternary layer. Certain etchants for etching through the graded layer and the ZnSe layer etch faster close to the resist stripe, with the result that a desired tapered or positively sloped mesa structure is achieved.

In accordance with another aspect of the invention, the etchant used for the grading layer and the ZnSe comprises a solution of ethylene glycol, methyl alcohol or methanol or other alcohol, HCl, and $Br_2$ in water.

The various features of novelty which characterize the invention are pointed out with particularity in the claims annexed to and forming a part of this disclosure. For a better understanding of the invention, its operating advantages and specific objects attained by its use, reference should be made to the accompanying drawings and descriptive matter in which there are illustrated and described the preferred embodiments of the invention, like reference numerals identifying the same or similar elements.

DETAILED DESCRIPTION OF THE PREFERRED EMBODIMENTS

The invention is generally applicable to all semiconductor laser diodes made in II-VI semiconductor materials. Such devices comprise a stack of II-VI layers epitaxially grown on, typically, a GaAs substrate. Reference is made to U.S. Pat. No. 5,363,395, whose contents are incorporated herein by reference, which describes one of a number of different schemes for fabricating laser devices in II-VI materials. Such lasers are particularly important as sources of blue-green light.

Figure 1:
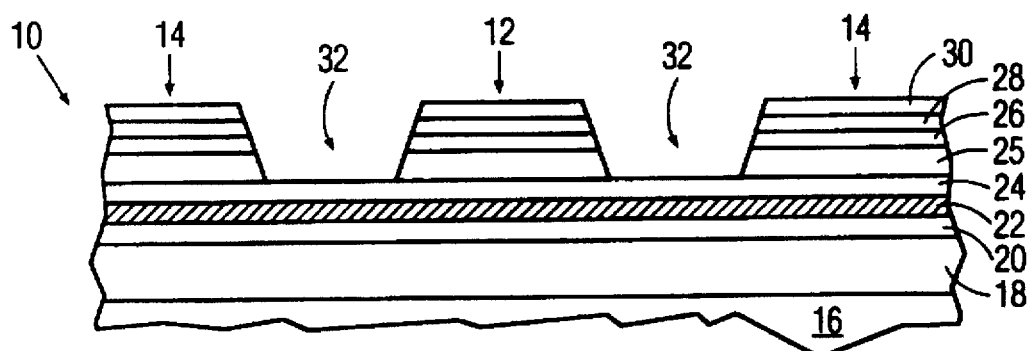
FIG. 1 is a schematic view, not to scale, of the structure of a laser of the ridge in a channel type.

FIG. 1 illustrates one such laser structure suitable for generating blue-green light. What is illustrated in FIG. 1 is part of the epitaxial structure 10 after formation of the active area 12 and flanking support mesas 14. What is not shown as not important to the invention are the subsequent deposition of insulating and metallization layers to form contacts to the active mesa top and substrate bottom. A typical geometry for a III-V laser diode of the ridge in a channel type is illustrated in U.S. Pat. No. 5,399,885, Electron. Lett., 1979, 15, pp. 763–5, and Appl. Phys. Lett., 48 (2), 89 (1986), whose contents are herein incorporated by reference. As will be observed, the contact metallization to the active mesa top extends over the flanking mesas but is isolated therefrom.

Figure 2:
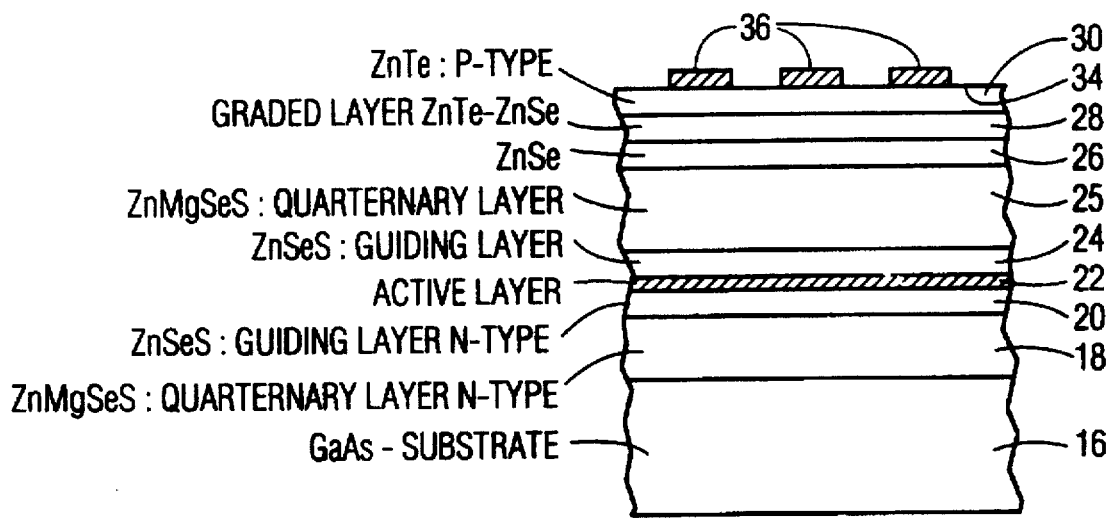
FIG. 2 is an enlarged view of the active mesa and underlying parts of the structure of FIG. 1.

The structure of one form of a laser for blue-green light emission is depicted more clearly in the enlarged schematic view of FIG. 2. A semiconductor crystal substrate 16 of GaAs is provided, and grown thereon by conventional epitaxy techniques, such as MBE, are a quarternary cladding layer 18 of ZnMgSeS followed by a thin wave guiding layer 20 of ZnSeS, followed by the lasing active layer 22 of ZnCdSe forming a quantum well. All the layers below the active layer 22 are of N-type conductivity. On top of the active layer are then grown, all of P-type conductivity, wave guiding layer 24 of ZnSeS, followed by another quarternary cladding layer 25 of ZnMgSeS, in turn followed by a ZnSe contact layer 26, a graded layer 28 of ZnTe-ZnSe, and finally a cap layer of ZnTe 30. The contact layer 26, the grading layer 28, and the cap layer 30 provide a good low-ohmic contact on the P side of the structure. The contact layer 26 accepts a high dopant level, and the grading layer 28 acts as a transition between it and the cap layer 30. Examples of the thicknesses of the layers, and their compositions and that of their dopant species to provide the desired type and level of conductivity can be found in the referenced U.S. Pat. No. '395 patent. The layers as grown extend across the entire wafer, and the next step is to define the mesa structure, typically about 1–10 μm wide, by etching parallel grooves 32 (FIG. 1) down through the structure to or in the proximity of the upper P-type wave guiding layer 24 to form the active mesa 12 and the flanking mesas 14. In the referenced Appl. Phys. Letters paper, the mesas are formed by selective wet chemical (solution) etching. In the referenced Electronics Letters paper, the mesas are formed by a combination of ion milling and wet chemical etching. Neither of those processes are suitable for the II-VI materials of the laser described in connection with FIG. 2. The known process for II-VI materials requires several etching steps including several photolithographic process steps and the inevitable mask alignment problems. The invention accomplishes this with a single photolithographic process completely avoiding the mask alignment problems.

In accordance with the invention, a conventional photolithographic process is used to lay down in a conventional manner over the surface of the wafer with its grown layers, indicated at 34 in FIG. 2, a conventional positive photoresist, e.g., of KTI or AZ from Shipley. Then, a conventional exposure and development process is carried out to pattern the resist layer to form narrow resist bars of typically 1–10 μm wide over the locations where the mesas 12, 14, 16 are to be produced. The resist bars are shown schematically in dashed lines at 36 in FIG. 2, to a different scale than that shown in FIGS. 1 and 2. As an example, not to be deemed limiting, 5 μm wide resist bars 36 are formed in the [110] or [–110] (–1=1 with a bar over the 1) direction on the [100] oriented surface of the top epitaxial layer 30. The following etchant solutions are then employed in sequence with the single patterned resist layer 36 in place:

1. For etching of the ZnTe layer 34, 1 vol. part of a solution of $H_2O$ (250 ml), $HNO_3$ (25 ml), $K_2Cr_2O_7$ (5 gr) to 4 vol. parts of water. The etching stops or significantly slows when the graded layer 28 is reached.

2. For etching of the graded layer 28 and ZnSe layer 26, including part of the quarternary layer 25, a 5-component solution of ethylene glycol (50 ml), methanol (25 ml), HCl (25 ml), $H_2O$ (25 ml), and $Br_2$ (0.25 ml), applied for about 2–4 min. at room temperature.

3. Etchant #2 is followed by $H_2SO_4$:$H_3PO_4$ (1:1) for about 1 min. in an ultrasonic bath to remove any Se that may have been left over from the #2 etchant.

4. For the remainder of the quarternary layer 25, about 5 min. of conc. HCl or HBr. The etching continues just until the ternary wave guiding layer 24 is reached.

Figure 3:
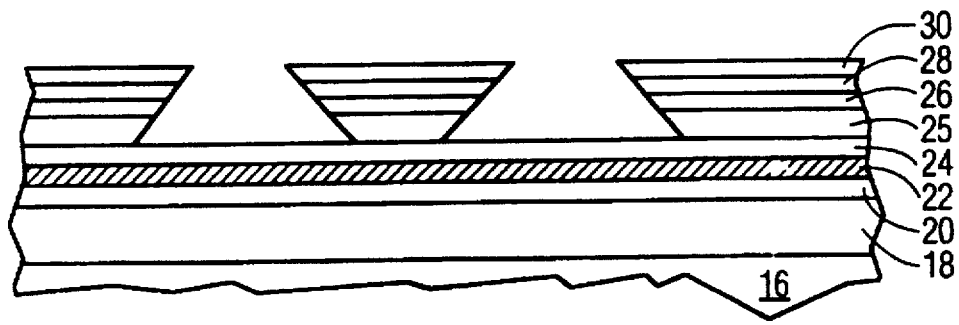
FIG. 3 is a view similar to FIG. 1 of the structure of another laser of the ridge in a channel type.

The etch rate of the ternary layer 24 is much lower than that of the layers above it so that the ridge or mesa height is mainly determined by the thickness of the quarternary layer 25. The shape of the mesa depends upon the crystal orientation of the layers. When the mesa stripe is oriented in the [–110] direction, the mesas appear as illustrated in FIG. 1, which have positively sloped sides that widen in the downward direction. When the mesa stripe is oriented in the [110] direction, the mesas appear as illustrated in FIG. 3, which have negatively sloped sides that narrow in the downward direction.

The mesa structure obtained in FIG. 1 is preferred because it assures good coverage of the mesa sides with subsequently applied deposited insulating layers and metallization layers. The excellent profile obtained is a result of the action of the #2 etchant on the graded, ZnSe, and quarternary layers. It has been found that this etchant tends to etch those layers faster at points closer to the resist than at points more remote from the resist. As a result, the positively sloped mesas indicated in FIG. 1 are obtained.

It will be appreciated that it is the composition of the active stripe region in the active mesa that determines the laser properties, and the composition of the flanking mesas is not significant as they perform mainly a mechanical function, but the composition of the layers in the flanking mesas happens to be the same as that of the active mesa, as they are part of the the same wafer on which the layers are epitaxially grown, but by the processing of the invention can be covered in an easy way with an insulating layer so that current conduction is prevented. The invention is not limited to wafers or bars built up from GaAs substrates but is also applicable to wafers or bars using other semiconductor compounds or elements.

Following the etching of the grooves 32 and the deposition of an electrically isolating layer, the structure is patterned for the metallization, and then a metallization layer deposited in the usual way, typically by vapor deposition. As mentioned, the arrangement of the active mesa in a channel flanked by support mesas allows the laser chip to be mounted with its P-type side down on a suitable heat sink for improved cooling.

The principal advantage of the invention is to allow the use of only a single photolithographic process for forming the grooves that define the mesa structure and the supporting structures.

The invention is not limited to the specific compositions given as an example for the cap, graded, contact, and cladding layers. Other compositions will also be suitable for the improved process as described. For example, the cap layer 30 can be constituted of BeTe, the graded layer 28 of ZnBeSe, the contact layer 26 of ZnSe, and the cladding layer 25 of ZnMnSSe.

Moreover, etchant #1 can be substituted by $H_2O$ (250 ml), $H_2SO_4$ (25 ml) and $K_2Cr_2O_7$ (5 grams).

With etchant #2, the ethylene glycol content can vary between about 40–60 ml, the methanol content between about 20–30 ml, the HCl content between about 20–30 ml, the $H_2O$ between about 20–30 ml, and the $Br_2$ content between about 0.2–0.3 ml. Also, glycerine, any alcohol or $CCl_4$ can be substituted for the methanol, HBr for the HCl, and glycerol for the ethylene glycol. Other substitutions include $Br_2$ in an amount of about 0.375 vol. % of the solution.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A method for fabricating a semiconductor laser device of the ridge in a channel type from a semiconductor structure, said semiconductor structure comprising a semiconductor crystal substrate and a plurality of layers formed by epitaxial deposition on the substrate, said layers including an active layer and, above the active layer, a wave guiding layer, a cladding layer, and a contact layer, said layers comprising II-VI materials, the method comprising the steps of:

(a) providing over the layers a patterned resist layer with openings where one or more grooves are to be etched, this providing step using a photolithographic process, and (b) forming an active mesa flanked by support mesas by etching the grooves through the layers toward the active layer while the resist layer remains in place and without using a second photolithographic process.

2. The method of claim 1, wherein the grooves are formed by wet chemical etching alone.

3. The method of claim 1, wherein the layers include a cap layer comprising CdTe, ZnTe, or BeTe.

4. The method of claim 1, wherein the layers include a graded layer comprising ZnTe-ZnSe.

5. The method of claim 1, wherein the layers include a contact layer comprising CdSe or ZnSe.

6. The method of claim 2, wherein the wet chemical etching includes etching with a 5-component solution of ethylene glycol, an alcohol or $CCl_4$, HCl or HBr, and $Br_2$ in water.

7. The method of claim 1, wherein the ethylene glycol, an alcohol or $CCl_4$, HCl or HBr, and $Br_2$ in water are in relative proportions in volume parts of about 2:1:1:0.01:1.

8. The method of claim 1, wherein the providing step comprises orienting said openings relative to a selected crystal direction of the layers so as to form mesas having a selected cross-sectional shape.

9. A method of fabricating a semiconductor laser device of the ridge in a channel type, said laser device having a semiconductor crystal substrate and one or more layers formed by epitaxial deposition on the substrate, the layers including a graded layer comprising II-VI materials, the method comprising the steps of:

(a) providing over the surface of the layers a patterned photoresist layer; and (b) etching the graded layer using a first etching composition which is masked by said patterned photoresist layer, said etching composition comprising an aqueous solution of (i) bromine, (ii) an acid, (iii) a first compound chosen from the group consisting of glycerine, an alcohol and carbon tetrachloride, and (iv) a second compound chosen from the group consisting of ethylene glycol and glycerol.

10. The method of claim 9, wherein the water, bromine, acid, first compound and second compound are in relative volumetric proportions of approximately 1:0.01:1:1:2.

11. The method of claim 9, wherein the first etching composition comprises bromine in an amount of about 0.375% of the solution.

12. The method of claim 9, further comprising having a graded layer comprising a compound chosen from the group consisting of ZnTe-ZnSe and ZnBeSe.

13. The method of claim 9, further comprising having a layer comprising a contact layer and using the first etching composition to etch said contact layer.

14. The method of claim 13, further comprising providing a contact layer comprising a compound chosen from the group consisting of CdSe and ZnSe.

15. The method of claim 13, further comprising having a layer comprising a cladding layer and using the first etching composition to etch, at least partially, said cladding layer.

16. The method of claim 15, further comprising, following etching using the first etching composition, etching the cladding layer using an acid.

17. The method of claim 16, further comprising having a layer comprising a cap layer and etching said cap layer using a second etching composition, said second etching composition comprising an aqueous solution of an acid and $K_2Cr_2O_7$.

18. The method of claim 17, wherein the solution comprises approximately 1.375 ml of water, 5 gr of $K_2Cr_2O_7$ and 25 ml of an acid chosen from the group consisting of $HNO_3$ and $H_2SO_4$.

19. The method of claim 17, wherein the cap layer comprises a compound chosen from the group consisting of BeTe, CdTe and ZnTe.

20. The method of claim 9, further comprising having a layer comprising a cladding layer and, following etching using the first etching composition, etching the cladding layer using an acid.

21. The method of claim 20, wherein the acid used in etching the cladding layer comprises a compound chosen from the group consisting of HCl and HBr.

22. The method of claim 20, further comprising having a layer comprising a wave guiding layer and said etching of said cladding layer is performed until said wave guiding layer is reached.

23. The method of claim 20, further comprising, prior to etching the cladding layer using an acid, treating the surface of the layers using $H_2SO_4$:$H_3PO_4$.

24. The method of claim 20, further comprising having a cladding layer comprising a compound chosen from the group consisting of ZnMnSSe and ZnMgSeS.

25. The method of claim 9, wherein said providing step further comprises orienting patterns of the patterned resist layer relative to the substrate so that the etching step forms a mesa having positively sloped sides.

* * * * *